United States Patent [19]

Forrest

[11] Patent Number: 5,260,154
[45] Date of Patent: Nov. 9, 1993

[54] EVALUATING PHOTOLITHOGRAPHIC EXPOSURES

[75] Inventor: Gary T. Forrest, 791 Sunset Dr., San Carlos, Calif. 94070

[73] Assignee: Gary Forrest, Carmel, Calif.

[21] Appl. No.: 848,088

[22] Filed: Mar. 9, 1992

[51] Int. Cl.$^5$ .............................................. G03C 5/00
[52] U.S. Cl. ..................................................... 430/30
[58] Field of Search ........................................ 430/30

[56] References Cited

PUBLICATIONS

Qui Jiabai et al., "Vinylidene Chloride-Methyl Acrylate Copolymer and Polyvinylcarbazole-Photosensitive Polymer System," *Journal of Photopolymer Science and Technology*, vol. 1, No. 2, 1988, pp. 295-302.

Wang Yanqiao et al., "A New Recording Material-Acid Sensitive Film and Its Process," *Kexue Thongbao*, vol. 27 No. 7, Jul. 1982, pp. 730-734.

"UV SensorCards," *Sensor Physics*, Sensor Physics, 481 Seaport Court, #101, Redwood City, Calif. 94063, U.S.A., 2 pages.

"UV LaserCards," *Sensor Physics*, Sensor Physics, 481 Seaport Court, #101, Redwood City, Calif. 94063, U.S.A., 2 pages.

"Deep UV Stepper Beam Diagnostics," *MICROlithography News*, Sep./Oct. 1990, pp. 12-13.

"Powerful, Portable, Easy to Use Laser Beam Diagnostics," *Sensor Physics*, Sensor Physics, 481 Seaport Court, #101, Redwood City, Calif. 94063, U.S.A., 2 pages.

"Film Sees the UV for Laser-Beam Profile," *Laser Focus Word*, Pennwell Publishing Company, Nov. 1990, 4 pages.

"Ends the Reign of Water in Photomask Production?" GAF, GAF Corporation 140 West 51 Street New York, N.Y. 10020, U.S.A., Jan, 1, 1977, 9 pages.

"Model 311 Intensity Profiler," *Optical Associates Inc.* (OAI), Optical Association Inc., 1425 McCandless Drive, Milpitals, Calif. 95035, U.S.A., 1988, 2 pages.

"Scanning Projection Aligner UV Energy Meter Model 1405," *Chromadyne*, Chromadyne, 213 E. Maude Avenue, Sunnyvale, Calif, 94086, U.S.A., 2 pages.

"SensorPhysics Product Summary," *Sensor Physics*, Sensor Physics, 481 Seaport Court, #101, Redwood City, Calif. 94063, U.S.A., 2 pages.

"Stepper Uniformity Mapping System *SUMS)," *Optical Associates Inc.* (OAI), Optical Association Inc., 1425 McCandless Drive, Milpitals, Calif. 95035, U.S.A., 1988, 4 pages.

"Stepper UV Energy Meter Model 1400," *Chromadyne*, Chromahyne, 213 E. Maude Avenue, Sunnyvale, Calif. 94086, U.S.A., 2 pages.

*Primary Examiner*—John Kight, III
*Assistant Examiner*—T. Mosley

[57] ABSTRACT

A method for evaluating line-width uniformity in photolithographic exposure patterns involves placing a film with a polymer binder on a wafer stage of a photolithographic system. The photolithographic source is radiated through a mask so that the mask pattern is imposed on the film. The radiation induces photolysis that releases protons from the binder. The protons induce color changes in an acid-sensitive dye material. The pattern of color changes constitutes a film image of the exposure pattern. The film image is projected, magnified and digitized to form a gray-scale image. A threshold criterion is selected and applied to the gray-scale image to yield a monochrome image. Photolithographic lines with one micron and lesser widths are clearly discernible. Photolithographic-exposure line-width uniformity can be evaluated visually by displaying the monochrome image and quantified by computer analysis of the monochrome image.

2 Claims, 5 Drawing Sheets

EVALUATING PHOTOLITHOGRAPHIC EXPOSURES

BACKGROUND OF THE INVENTION

The present invention relates to methods for evaluation of semiconductor processing and, more particularly, to a method for evaluating the exposure pattern provided by a photolithography system. A major objective of the present invention is to provide a method providing for enhanced evaluation photolithographic line uniformity.

Much of recent technological progress is associated with the increasing integrated circuit miniaturization afforded by advances in semiconductor processing. The degree of miniaturization can be quantified by a line width or feature size. In this vein, one micron technology provides for denser, more sophisticated and faster integrated circuits than does two micron technology. Still further advances are provided by submicron processing technology.

Each line width reduction places further demands for precision and uniformity on the photolithographic system used to define the features of the integrated circuit. In photolithography, a photoresist is exposed to a pattern of light. The light chemically alters the exposed portions of the photoresist, while the unexposed portions remain unchanged. The chemical alteration allows the photoresist to be selectively removed, leaving only the unexposed portion (of a positive photoresist) or only the exposed portion (of the more common negative photoresist).

Typically, the photoresist itself is not of direct interest. However, underlying material of interest can be exposed by the removal of photoresist. The exposed underlying material can be processed, while material underlying remaining photoresist is protected. The resulting patterned processing is used to define circuit features. These features can be, for example, conductors, semiconductors, and dielectrics.

In many cases, the photolithographic pattern is imposed by shining a nominally uniform light source through a patterned mask so that the mask pattern is projected on a photo-resist coated wafer. Typically, a semiconductor wafer is processed to yield a multitude of identical integrated circuits. Accordingly, a stepper can maneuver a wafer below the mask so that its pattern can be imposed at many predetermined locations on a wafer.

Diffraction of light by a mask can limit photolithographic resolution. Accordingly, direct write systems can be used. For highest resolution, higher frequency illumination is employed. Electron beam (E-beam) systems, accordingly are available for submicron processing. Particle accelerators are used as direct write beam sources for the highest resolutions currently available. In both the mask-based approach and the direct write approach, a repeatable photolithographic pattern is imposed. In the mask-based approach, the pattern is imposed spatially, and in the direct-write approach, the pattern is imposed temporally.

It is, of course, critical that the light pattern used to define these features be applied with precise localization and intensity. For example, a set of parallel conductive traces should be characterized by constant line widths. Otherwise, some of the lines could: fail to conduct; exhibit higher than acceptable resistances; be subject to unacceptable cross talk; short circuit; or be more prone to break down with repeated use.

To avoid considerable waste of time, money and resources, photolithographic systems are evaluated either in response to detected defects or in anticipation of potential defects. A gross evaluation is available by quantifying the number of defective devices yielded by a system. By examining a completed device microscopically, the location and nature of defects can sometimes be determined. A more refined diagnosis can be achieved by examining wafers at various stages of processing. This can exclude some possible sources of defects from further consideration. Approaches that evaluate a system based on the results on a wafer are considered "exemplar" based.

One problem with these exemplar approaches is that it is difficult to deconvolve the effects of the different aspects of processing. For example, a defect may be due to anomalies in the exposure pattern, problems with a deposition, an etch, an implant, a chemical reaction, etc. A more complete diagnosis can be achieved by looking at the effects of one of these factors in isolation.

The photolithographic pattern lends itself to such an isolated analysis. The exposure can be evaluated independently of its effects in combination with other processing aspects. If no exposure defects are found, the defects can be assumed to be due to another source. Detailed examination of other processing aspects can then be investigated with greater confidence. If exposure defects are found, these can be corrected prior to new evaluation runs. The new evaluation runs can be used to find additional defect sources.

To take advantage of computing power to analyze images, a digital image is desired. Direct digital images are most desirable. However, devices such as charge-coupled devices (CCDs) that would otherwise be suitable, are considerable thicker than most wafers. When a CCD is placed on the wafer stage used for successive stepping the integrated circuits for exposure, the surface of the CCD is significantly above the typical wafer plane. Hence, the CCD would detect different and relatively unfocused pattern that would be difficult to compare to the pattern actually imposed on a wafer. Changing beam focus can provide a sharper image, but conditions would then vary from those to which the wafer is subjected. Theoretically, the stage on which wafers are mounted could be lowered to allow the CCD to match the wafer plane. However, it can be impracticable to recover precisely the original stage settings. In general, such disturbances of processing equipment are considered unacceptably intrusive.

An alternative digitizing approach uses a single optical fiber to interrogate a beam pattern pixel-by-pixel. The fiber can be mounted in a frame that can lie on the wafer stage. The fiber can extend horizontally except at one end that is turned upward. Optical fibers are sufficiently flexible that the upward facing end can be at the wafer plane. The frame, and thus the upward facing fiber end, can be raster scanned through the illumination field. The intensity of light exiting the opposite end of the fiber can be measured and recorded. The recorded data can be assembled into a digital image.

A major problem with fiber optic sampling is the limited resolution given available fiber cross sections. Another problem is that the exposure required for serial interrogation is much longer than that typically applied to a wafer, making the actual and test situations somewhat incomparable. In addition, there can be a problem assembling the serially acquired image precisely, especially since jitter can cause registration to vary during the relatively long exposure. Furthermore, it is undesirable to operate the large, expensive and power hungry light sources used in photolithography for such long exposures.

To avoid the long exposure required for serial digitizing, an exposure pattern can be captured on film; the film image can then be digitized "off line" as it was. Conventional films require development that can introduce artifacts in the image. One then has the problem of deconvolving these artifacts from the exposure pattern. This is analogous to the problem with exemplar evaluation. If standard photoresist is used as the film, the problems are more than analogous. In general, conventional films are undesirable for evaluation since the development time adds to the down time of a costly fabrication system.

"Super resolution films" are known that provide "direct" images without development. Such films have been used to evaluate photolithographic masks. However, while the exposures required for the use of such films are short relative to serial digital acquisition, they are long relative to the time photoresists are exposed. Accordingly, there is loss of time-varying information and vulnerability to jitter. To minimize the effects of jitter, a contact print can be made of the mask. In this case, however, the image is acquired far from the wafer plane, which is undesirable.

None of the methods discussed above has been used successfully to evaluate exposure patterns near the plane of the wafer. Grosser evaluations of intensity distributions have been made during a period when a mask is removed. Reports have been made of relatively poor quality mask projections taken away from the wafer plane. None of the methods has come close to providing means for evaluating the uniformity of line widths in an exposure pattern. Thus, it has not been possible to evaluate contributions of mask errors to line width variations and the myriad of defects and reliability problems with which they can be associated.

What is needed is a method for evaluating exposure pattern line widths. Preferably, such a method would acquire images over short durations and on the wafer plane. Furthermore, the method should be compatible with and minimally disruptive of wafer fabrication systems.

SUMMARY OF THE INVENTION

The present invention involves the use of a direct print film that is homogeneous on the scale of the photolithographic wavelength $\lambda$. The film is placed on the stage of the photolithography system. A photolithographic pattern is imposed on the film under conditions comparable to which such a pattern would be imposed on a photoresist-coated wafer. This exposure causes protons to be released as part of an acid from a polymer binder for the film. The protons diffuse to interact with a dye material, causing it to change color. The resulting color pattern is a film image of the exposure pattern. The film image is magnified by a factor of at least 10 and then digitized. A threshold criterion is selected and applied to the digitized image to obtain a thresholded image in which photolithographically defined lines are clearly defined. The lines can be examined visually or computationally to evaluate line-width uniformity of the photolithographic exposure pattern.

The direct print film includes a photosensitive layer that is homogenous on the scale of the mean wavelength $\lambda$ of the photolithographic system. This means that the photosensitive layer is free of particles with dimensions between about 0.25 $\lambda$ and 4 $\lambda$. This can be achieved by integration of photosensitive components with a polymer film binder. In the absence of a gradient or steps, "homogeneous", as used herein, would be equivalent to "uniform". However, the present invention provides for the use of gradient and stepped photosensitive layers. In other words, the present invention requires a photosensitive layer with wavelength-scale uniformity in the chemical distribution of the photosensitive layer after any gradient or step has been factored out.

Films meeting the foregoing requirement for wavelength-scale homogeneity have been developed. These films include a chemical complex serving as the binder for the layer. The complex includes at least two chemical components, at least one bears a electrophilic agent such as a halogen, while the other is a polymer. The components can be covalently bonded to define a copolymer or more loosely associated to define a more general complex.

Incident radiation causes dissociation of a halogen acid from the complex. Relatively short wavelengths, e.g., 193 nanometers (nm), have the energy to dissociate the halogen acid where the components are covalently bonded. Longer wavelengths, e.g., 360–365 nm from the halogen-bearing component can lack sufficient energy to break an unmodified covalent halogen bond. In films including a non-covalently bonded complex, the noncovalent bonds weaken the covalent halogen bonds, permitting dissociation by longer wavelengths. In either case, the resulting halogen acid, or more specifically, the proton thereon, interacts with the dye material to produce a color change in the pattern of the photolithographic illumination. A "dye material" is a dye or other material that changes color under specified conditions.

Magnification of the film image is used to match features of interest to the relatively low resolution of a digitizing array. Given that the features of interest are at most a few microns wide and can be less than a micro wide, magnifications of at least a factor of 10 are required. More generally, magnifications of 100× or more can be used without exceeding the resolution provided by a digitizing array. It should be noted that the film can have an area of 300 cm$^2$ or more so both high resolution and wide field of view are achieved.

The digital image is preferably a gray scale image that retains a practical amount of the continuous tone information provided by the film image. However, images with many gray scales can be difficult to interpret. Accordingly, a threshold criterion can be selected to simplify the gray-scale image. For example, an intermediate gray scale level can be selected as a threshold. All pixels in the gray scale image having an intensity at or above the criterion can be set to a maximum intensity value, while all pixels having an intensity value below the criterion can be set to a minimum. The result is an easily interpreted monochrome (black and white) image. Lines in such an image can be readily discerned and line-width uniformity readily evaluated by the human eye. Furthermore, quantification of line-width uniformity can be automated using the monochrome image data.

The present invention is achieved in part due to a discovery that the quality of the photographic image obtained has surprisingly high quality. The improvement in image quality compared to previously employed gelatin films was much greater than a comparison of their published resolutions would indicate. In fact, the reported resolution of the homogeneous films was about half the reported resolution of the gelatin films. One would conclude that the lower resolution films would not provide substantially superior resolution.

Surprisingly, in the context of the application of the present invention, the resolution of the homogeneous films turned out to be at least five times that of the gelatin films. This unexpected achievement in resolution permits characterization of line widths used in state-of-the-art integrated circuit manufacture.

Further investigation provided a possible explanation for the surprising extent of the improvement. The gelatin-based films include a suspension of photosensitive particles. The particles constituted non-uniformities in the media on a scale comparable (0.25 $\lambda$ to 4 $\lambda$) to a wavelength. These particles localized photosensitivity, rendering the response of the film nonuniform, thus imparting a granularity to the image.

The particles also scatter light both during exposure and during viewing, reducing resolution. The effects of the granularity can be overcome by longer exposures. However, the longer exposures have the disadvantages discussed in the background section above, namely time-varying effects are obscured, expensive lamp use is employed, and images are blurred due to jittering. The homogeneous films employed by the present invention avoid the problem of granularity. Therefore, short exposures on the order of those used for photoresist are sufficient to produce a quality image of the photolithographic pattern.

Since the film is direct positive, no development is required. This avoids development artifacts in the image and avoids delays while development is implemented. An image is acquired instantly and the lamps can be turned off during digitization and analysis. These and other features and advantages of the present invention are apparent in the following description with references to the drawings below.

DESCRIPTION OF THE PREFERRED EMBODIMENTS

Figure 1:
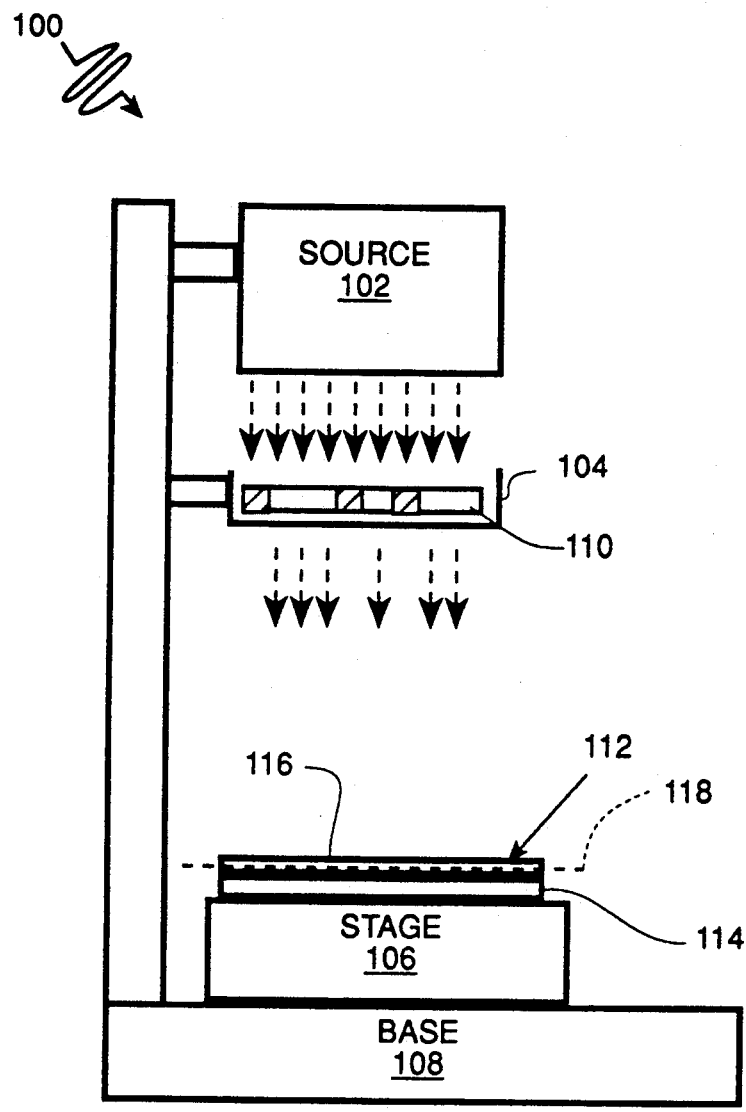
FIG. 1 is a schematic illustration of a photolithographic exposure evaluation system in accordance with the present invention.

A photolithography system 100 comprises an illumination source 102 with integrated optics, a mask holder 104, a stage 106, and a base 108, as shown in FIG. 1. A mask 110 is mounted in mask holder 104. During fabrication, a photoresist-coated wafer is mounted on stage 106, which steps relative to mask 104 so that the mask pattern is imposed at multiple locations on the photoresist as is well known in the semiconductor processing art.

Figure 2:
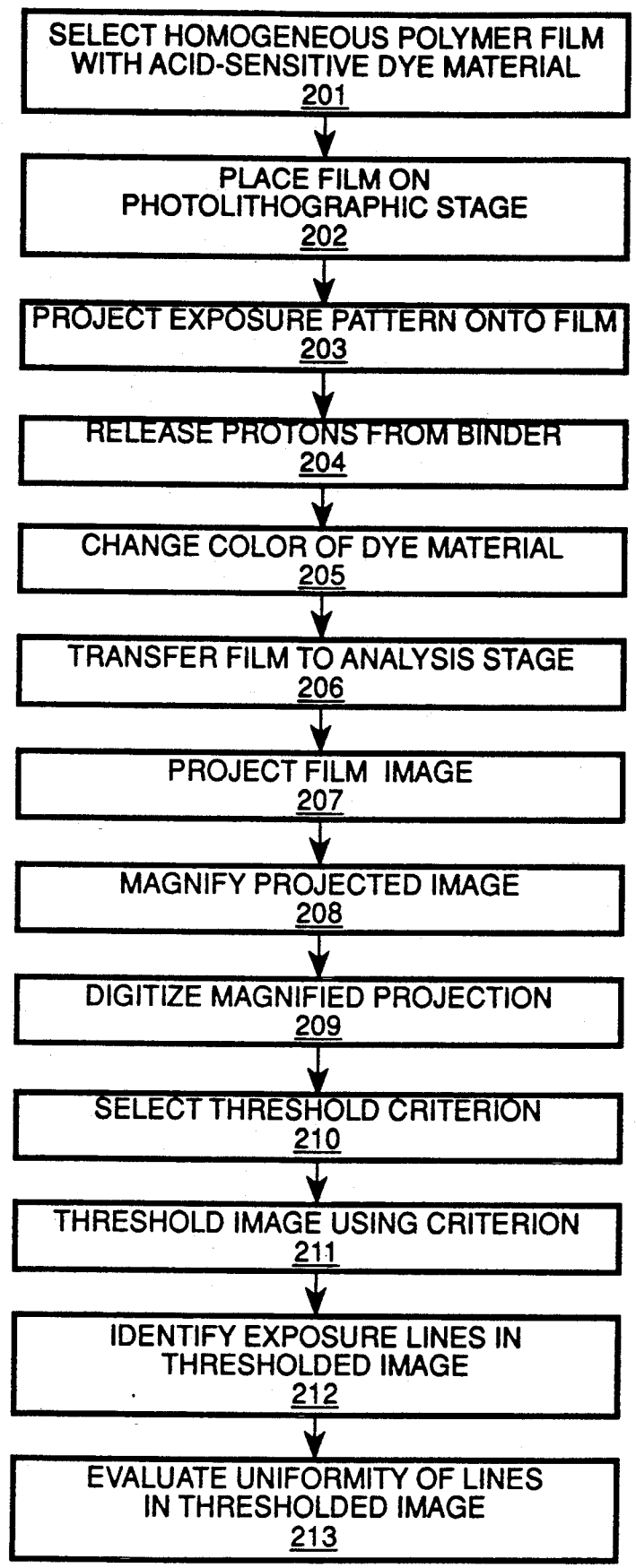
FIG. 2 is a flow chart of a method in accordance with the present invention.

In accordance with the present invention, a method 200, flow charted in FIG. 2, provides an evaluation of the line width uniformity provided by system 100 and mask 104 at the wafer plane, i.e., the plane in which the photoresist would lie. Method 200 involves a step 201 of selecting a direct film for imaging the photolithographic exposure pattern at the wafer plane.

Certain characteristics of the film are general, while others are dependent on the illumination. To overcome the granularity characterizing prior films, the film should have homogeneous on the scale of the wavelength of the exposure source. For this to occur, the photosensitive mechanism should be distributed on a molecular level, rather than on a particle basis. Wavelength scale homogeneity does not preclude the use of gradient and stepped film profiles, since these profiles on are a scale different of the photolithographic wavelength.

Generally, the film should include a polymer binder and an acid-sensitive dye material. The dye material can be a dye that changes color in response to a hydrogen ion. Alternatively, the dye material can be a colorless substance that acquires a color in response to a hydrogen ion. The film should be composed so that at least one wavelength of light can cause the polymer binder to release protons. The released protons can then induce color changes in the dye material. The pattern of color change then constitutes an image of the wafer plane exposure pattern.

The exact film composition can vary according to the wavelength of interest. However, in general, the film can include a complex having at least one polymer species that provides the color inducing proton and at least one halogenated or other electrophilic species that induces proton release. Short wavelengths have high associated energies that can be used to break relatively strong covalent bonds. Hence, the complex can be a copolymer between the proton-providing polymer and another polymer.

Longer wavelengths typically have lesser energies. Films for characterizing long wavelength patterns can have noncovalent complexes featuring relatively weak bonds between the polymer and the halogenated component. For example, a charge-transfer complex between a polymer and a halogenated material can have such noncovalent bonds. During photolysis the halogenated component interacts with the polymer to cause it to release a proton, which induces a color change. Within these broad factors, the chemical composition can be adjusted to provide optimal sensitivity at the wavelengths of interest. In addition, film thickness can be selected to balance sensitivity with spatial resolution.

The film can be formed by polymerization into sheets. Typically, a protective layer can be formed over the film. Preferably, a substrate or base can be provided beneath the film to provide support and to help maintain planarity. Conveniently, polymerization can be performed on the substrate.

The film assembly is placed on the photolithographic stage at step 202. FIG. 1 shows a film assembly 112 on stage 106. Film assembly 112 includes substrate 114 and photosensitive film 116. Substrate 114 is dimensioned so that film 116 is in wafer plane 118. Substrate 114 is also transparent to permit illumination therethrough for analysis. Alternatively, substrate 114 can be a diffusion plate that also admits illumination therethrough. In addition, the present invention provides for opaque substrates compatible with illumination from above film 116.

Source 102 is activated at step 203 to radiate mask 110 and project its pattern onto film 116. For some tests, a single exposure is made. In other cases, the film can be stepped as a wafer would be for a more complete analysis of the exposures provided by photolithographic system 100.

Photolysis is induced in film 116 at step 204 by continuing mask projection for a sufficient duration. Preferably, film 116 is selected so that an exposure duration typically applied to photoresist can cause sufficient photolysis for an image with useful dynamic range. The photolysis causes protons to be released from the polymer film binder. Generally, the protons are part of an acid of hydrogen and a halogen or other hydraphilic agent.

At step 205, the protons diffuses to the dye material, causing a reaction that results in a color acquisition or change. In other words, a dye can change color or a colorless dye material can acquire a color. The resulting color pattern is a film image of the mask projection at the wafer plane.

Figure 3:
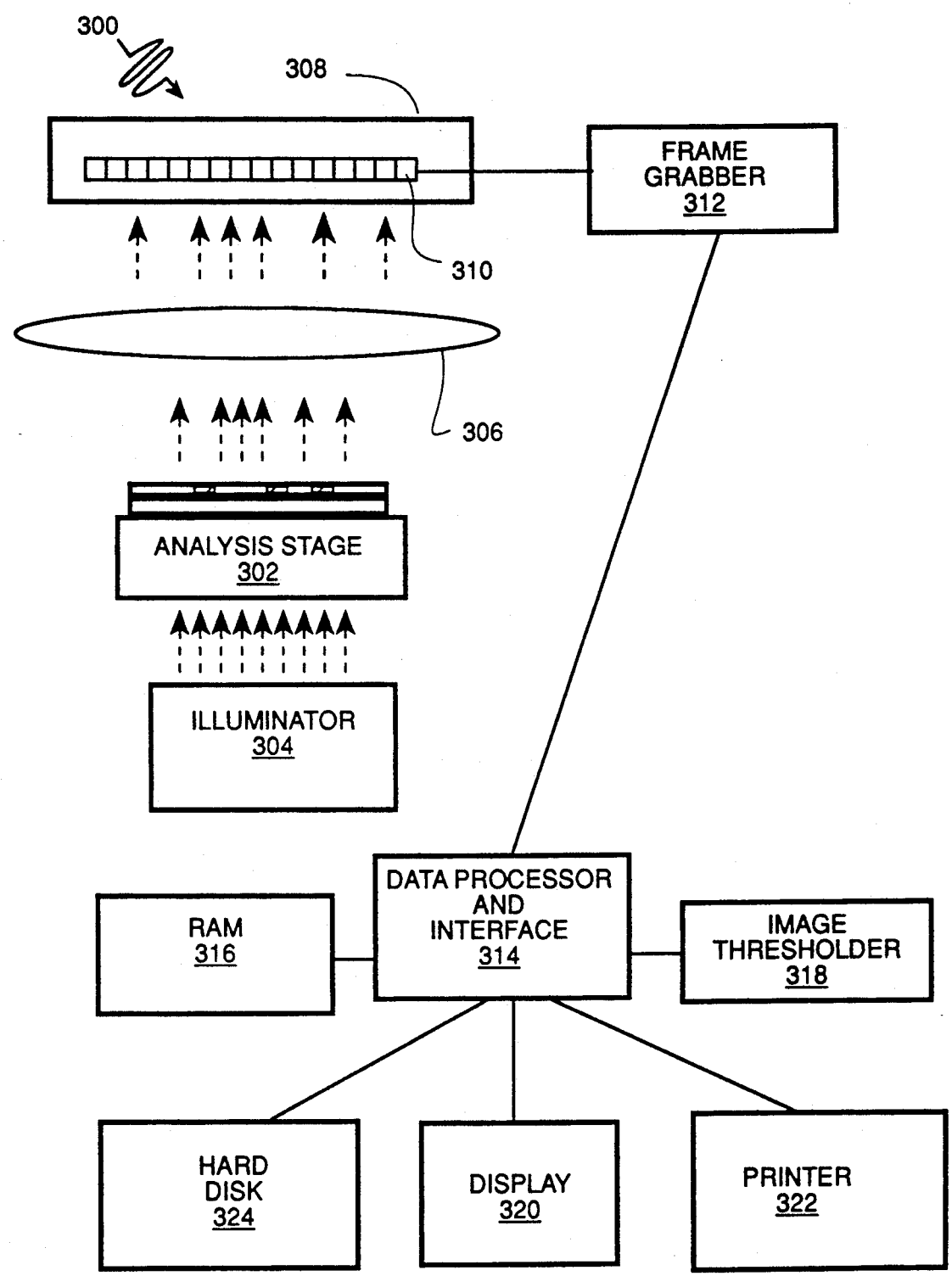
FIG. 3 is a schematic illustration of an image analysis system used in the method of FIG. 2.

At step 206, film assembly 112 is transferred from stage 106 to an image analysis system 300, illustrated in FIG. 3. In an alternative embodiment, an analysis system is integrated with a photolithography system so that a film assembly does not have to be moved for analysis. Film assembly 112 is mounted on a transparent analysis stage 302.

An illuminator source 304 is located below analysis stage 302. When activated, it illuminates film 116 through transparent polymer substrate 114 and projects the film image upward. Alternatively, film can be illuminated from above and the resulting reflection can be used. In either case, illumination is used to transmit a portion of the film image at step 207. The projected image is magnified by optics 306 at step 208. Optics 306, through drawn as a single lens, can be a microscope or other multi-lens assembly. Optics 306 magnifies the projected film image by a factor of at least 10 prior to its reception by camera 308.

Camera 308 is basically a video camera. It includes a charge-coupled device (CCD) 310 that captures the image projected thereon. CCD 310 comprises an array of discrete intensity detectors so that the captured image is inherently digitized at step 209. The resolution of CCD 310, which has 250,000 elements, is far less than that of film 116, which effectively has roughly 144,000,000 picture elements in an equivalent area. The purpose of optics 306 is to magnify the projected film image so that the features of interest can be resolved by CCD 310. Since the features of interest are or include photolithographic lines, magnifications of $10\times-100\times$ or greater are used, depending also on the desired field of a view. It should be noted that these magnifications are only useful because the resolution of the employed films exceeds their own specifications as well as the specifications of their main competitors. In addition, the dynamic range of the projected image can be matched to that of CCD 310 either using the cameras autoexposure function or by monitoring the image using the cameras viewfinder and adjusting the illumination provided by illuminator 304.

It should also be noted that the film can have an area comparable to that of a wafer. For example, film 116 can be a square with an area of 300 $cm^2$ for evaluation of a system for processing 8" wafers. The field of view at the CCD may correspond to roughly one thousandth of that area. Therefore, analysis stage 302 is capable of refined movement to allow selection of the area to be viewed by camera 308. Since camera 308 is a video camera, analysis stage 302 is designed to be stepped to permit the film area to be scanned by CCD 310. Thus, the output of camera 310 can be a series of digitized images representing successive sections of the film image. The successive images can be assembled to provide an assembled digital image covering a much larger area than that which can be captured in a single frame. Thus, analysis system is not limited by the number of elements on CCD 310.

Figure 4B:
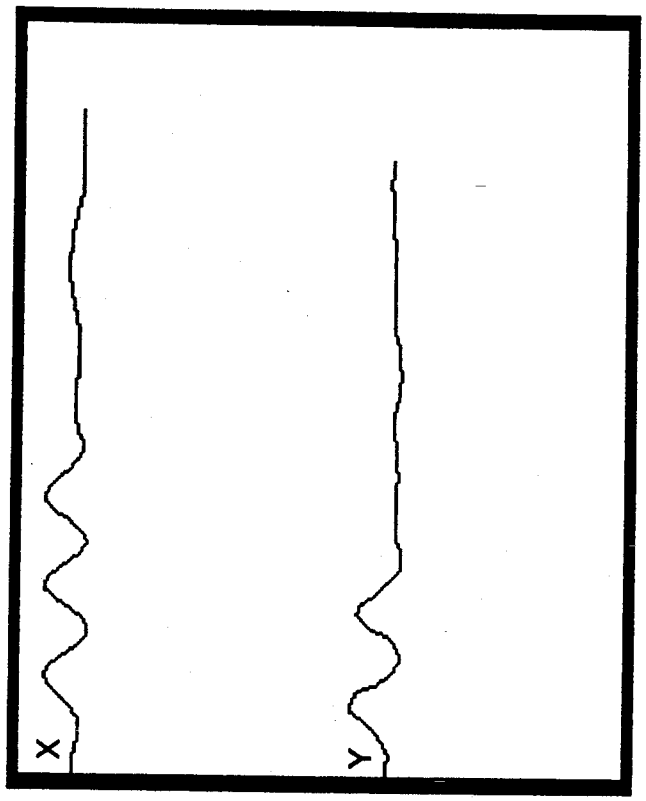
FIG. 4B is a graph indicating intensity versus linear position for two orthogonal lines in FIG. 4A.
Figure 4A:
FIG. 4A is a gray-scale digitized image acquired in the method of FIG. 2.

A half-tone representation of 256-level gray-scale digital image acquired by CCD 310 is shown in the photograph of FIG. 4A. Of course much of the detail is lost in reproduction. FIG. 4B shows intensity variations along two orthogonal axes of FIG. 4A. FIG. 4B illustrates the relatively continuous character of the image of FIG. 4A. The subject of FIG. 4A is a field with three L-shaped lines. These lines are more apparent after some image processing as described below.

The individual digitized images of "frames" are captured by a frame grabber 312. Subsequent operations are managed by a data processor 314 that includes interfacing for other processing components. Data processor 314 stores the gray-scale image in a raw image section of a random access memory 316.

Step 210 in method 200 involves selection of a threshold criterion. This step 210 can be performed at any time before steps 211-213. In other words, step 210 can be performed before any of steps 201-209. In some cases, a selection criterion will reflect a predetermined fixed value chosen to model a particular photoresist. In other case, a user may want to select different threshold criteria to compare their effects. Another approach is to select a criterion based on the image being examined. For example, an average image intensity value can be used as a threshold. In addition, a threshold criterion can involve threshold profiles that vary according to spatial position and multiple thresholds depending on the degree to which the number of gray-scale levels is to be reduced.

Data processor 314 conveys a copy of the gray-scale image to a thresholder 318 for thresholding, at step 211. The stored image effectively assigns a number representing image intensity to each pixel of the digitized image. Thresholder 318 assigns a threshold to each pixel. If the intensity value of the image at that pixel exceeds the threshold, the value is reassigned to a maximum value representing a maximum intensity (e.g., white in a gray scale image). Typically, the same threshold is assigned to every pixel. In practice, thresholder 318 is a computer program component operating through data processor 314.

Thresholder 318 is capable of a variety of image manipulations as well according to the selected criterion. For example, values below the threshold can be assigned a minimum value representing black. This yields a maximum contrast monochrome image. Alternatively, a distinct lower threshold can be used, so that some intermediate gray values remain. Dynamic range expansion can be used to remap remaining gray values to utilize the dynamic range vacated by thresholding.

Thresholds can vary as a function by pixel. This would, for example, permit comparisons between a digitized image and a previously obtained image. The previously obtained image could be of the same object at an earlier time to test for changes, or a similar object to test for intercircuit variations, or a synthesized model image to compare an actual image with an ideal image. Multi-level thresholding can be used to reduce the number of gray scale levels from, for example, 256 in an eight-bit system, to a smaller number, for example, four or eight levels, to facilitate interpretation by a human or to increase the rate of computer processing.

The simplest form of thresholding involves setting a single threshold value and driving all pixels to a maximum or a minimum depending on whether the image values are above or below the threshold. Values equal to the threshold can be arbitrary sent to either extreme. The thresholded image is stored in a threshold section of RAM 316. The thresholded image can be displayed on a display 320. The result of the thresholding is a monochrome image in which high-intensity (white) areas represent exposure and low intensity (black) areas represent masked areas. Lines are immediately discernible in such a picture and their uniformity or nonuniformity is immediately apparent to the human eye. The thresholded image can be compared with the original digitized image by alternating the section of RAM 316 coupled to display 320. Windowing software can permit side-by-side viewing of the images. Images can also be printed using printer 322. In addition, long term digital storage of digitized and threshold images can be provided by a hard disk 324.

Uniformity can be quantified as required by further processing. The threshold image can be directed to an image analysis system 300. Image analysis system 300 can use known mathematical algorithms to detect lines. For a detected line, the number of pixels on orthogonal to the line at each point on the line can be determined. Mean and standard deviations for the line width can then be calculated. Those skilled in the arts of pattern recognition and statistics recognize a multitude of different approaches to characterizing the line uniformity characterized by the thresholded images.

Figure 5:
FIG. 5 is a thresholded version of the image of FIG. 4A.

FIG. 5 shows the result of simple thresholding the digitized image of FIG. 4A using a first threshold. The threshold is set at a gray scale of 166. All intensities at 166 or above are set to 255 (white). All intensities below 166 are set to 0 (black). The three lines are clear and deviations from uniform thickness are clearly discernible.

Line-width uniformity can be quantified with further data processing generally as follows. A pixel-wide line (in this case L-shaped) can be selected within one of contiguous white regions. The line selection is not critical. For each point along the pixel-wide line, an orthogonal is defined. The number of white pixels belonging to the image line on each orthogonal can be counted. Each count corresponds to the line width at the respective points. The counts can then be statistically analyzed to determine a mean width and a standard deviation. The standard deviation serves as a measure of line-width uniformity. Those skilled in the arts of image analysis and statistics can determine a wide range of alternative quantifications for line width.

Figure 6:
FIG. 6 is another thresholded version of the image of FIG. 4A.

It might seem that if the widths are determined from a monochrome image, that the continuous tone film and the 256 gray scale digitized image were overkill. It would be simpler to use a high contrast film and/or a monochrome digitizer. However, this would only work if the exposure thresholds of either the film or the digitizer were the same as the exposure threshold of the photoresist. In general, different exposures are required to impose an image on high contrast film or digitizers. To illustrate this, the 256 gray scale image of FIG. 4A is thresholded at a different value, this time 175, and the results are shown in FIG. 6. In this case the exposure lines look thinner. If the photoresist operated at a threshold of 166 and the film at 175, line thickness would be erroneously represented.

Of course the continuous tone film and digitization have other advantages. Image intensity can correlate with feature thickness in some case or other feature characteristics. A continuous tone image can allow such a characteristic to be traced along a line or feature.

Figure 7:
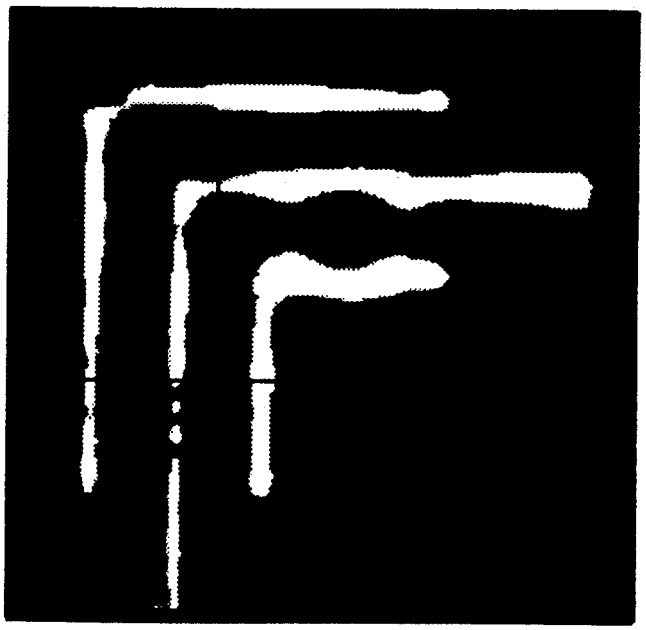
FIG. 7 is a superposition of the thresholded images of FIGS. 5 and 6.

By using continuous tone film and 256 gray scales, information is retained for 256 thresholds, or 256 different models for the photoresist. A single image can be used to explore the effect of different photoresists. FIG. 7 shows a 175 threshold image superimposed on a darker 166 threshold image. Another use of the dual threshold image of FIG. 7 is to provide an band of indeterminate imaging. The black areas can represent photoresist that would be definitely unexposed. The white areas can represent photoresist that would be definitely exposed. The gray areas could represent photoresist at an indeterminate transition point. This transition regions is likely to result in rounded corners in the photoresist. Another use of dual thresholding would be to assign gray to a desired level of exposure and white to an over exposure.

Two examples of film that can be used in accordance with the present invention are discussed in detail below.

Example 1

The first films is especially suited for photolithographic systems using light with wavelength of 193 nm. This film includes a polyester base. For electron-beam applications, this base can be coated with a thin transparent conducting layer of cuprous iodide. The photosensitive layer is coated over the cuprous iodide. The photosensitive layer includes vinylidene chloride-methylacrylate copolymer (VDCl$_2$-MA). The VDCl$_2$-MA has an average molecular weight of $3 \times 10^4$ and a chlorine content of 55%–60% by weight. The photosensitive layer also includes a dimethyl yellow (MDY) dye. Other suitable dyes include Congo Red A, pentametholyl Red at pH 1.2–3.2. This film is described by Qui Jibai and Wang Yangiao in "Vinylidene Chloride-Methyl Acrylate Copolymer and Polyvinylcarbazole—Photosensitive Polymer Systems", *Journal of Photopolymer Science and Technology*, Volume 1, Number 2 (1988) 295-302. These authors report a resolution of 500 lines per millimeter, which is too low for the line width determination of interest herein. However, further experimentation has shown the resolution of this film to be adequate. A copolymer film meeting these specifications is available from Sensor Physics, Incorporated, as Sensor Card Model UV-2SC.

The VDCl$_2$-MA serves as a binder for the film. Upon exposure to ultraviolet (UV) light, the VDCl$_2$-MA undergoes photolysis and releases hydrochloric acid (HCl). The H of the HCl interacts with the DMY to form a quinoid structure. This chemical change is accompanied by a absorption spectrum shift from a peak wavelength of 4200 Å (yellow) to a dual peak at 5.200 Å and 5500 Å (red).

Example 2

The second film is disclosed in the same article and is useful for photolithography at 360–365 nm. The second film base layer, a photosensitive layer and a protective layer. The base is polyester. The protective layer is of polyvinylpyrrolidone or other alcohol-soluble resin. The photosensitive layer includes charge-transfer complex (CTC) with polyvinylcarbazole (PVK) as the donor and Carbon Tetrabromide (CBr$_4$) as an acceptor. The photosensitive layer is covered with a protective layer. The photosensitive layer also includes a leuco base such as malachite green which serves as an acid sensitive dye. The PVK serves as a binder in the layer as well as the proton source during photolysis. A PVK film meeting these specifications is available from Sensor Physics, Incorporated, as SensorCard Model UVSC-I.

Upon radiation of light between 360 and 450 nm the complex is excited so that the complex breaks into ion free radicals as indicated:

$$CTC \rightarrow CTC^* \rightarrow PVK^{\bullet+} + CBr_4^{\bullet-}$$

The PVK+ then reacts with another CBr$_4$ to produce proton H+.

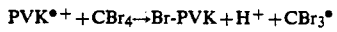

$$PVK^{\bullet+} + CBr_4 \rightarrow Br\text{-}PVK + H^+ + CBr_3^{\bullet}$$

The hydrogen ion reacts with the colorless malachite green to produce a green color. Different leuco bases can be used to obtain different colors. In most cases the leuco base is colorless. Depending on the leuco base, green, blue, violet, red, dark green, yellow, and pink colors can be obtained. One PVK system converts a yellow leuco base to red, as disclosed in the cited Qui Jibai article. Normally the image is digitized before it reverts. However, the film can be fixed after digitization by abstracting unreacted CBr$_4$.

The compositions of the two films can be varied to adjust the sensitivity and resolution of the film. Different chemical compositions can affect the wavelengths for which the film is suited. For example, the PVK of the second example has three conjugated aryl rings. A PVK with only two conjugated rings would require greater energy for photolysis. Accordingly, wavelengths such as 200–300 nm could be accommodated.

While photolithography is the main application discussed herein, the present invention has other applications. Unmasked illumination patterns can be examined to test for source uniformity both within and without photolithography. The present invention can be applied to defect detection. In general, the gray-scale intensity of a defect will be different than the gray-scale intensity of the intended features. By setting appropriate thresholds, it is generally possible to enhance the distinction between the defect and intended features. In effect, the intended features can be "thresholded out" so that the remaining image is a map of the defects. Once the defects are detected they can be counted and sized. The sizing information can help determine the source of the defedcts.

Some applications require predetermined exposure profiles. Ideal profiles can be compared with actual profiles. This can be implemented by using the ideal profiles to define thresholds to produce error images. These and other modifications to and variations upon the described embodiments are provided for by the present invention, the scope of which is limited only by the following claims, in which preambles and whereby clauses are not intended as limitations.

What is claimed is:

1. A method of evaluating a photolithographic exposure pattern for fabricating semiconductor integrated circuits, said pattern being projected by radiation having a characteristic wavelength, said method comprising:

selecting a film having a photosensitive layer that is homogeneous on the scale of said characteristic wavelength;

placing said film on an exposure stage of a photolithographic system;

transmitting a photolithographic pattern onto said film;

inducing proton release from a polymer binder of said film by continuing the transmission for a sufficient duration;

causing said protons to interact with an acid sensitive dye material so as to induce a color change in said dye material so that the pattern of the color change constitutes a film image of said photolithographic pattern;

illuminating said film so as to transmit a portion of said film image;

magnifying the transmitted image by a factor of at least 10;

digitizing the magnified projected image so as to form a digitized image in which each pixel has an associated gray-scale intensity value;

selecting a threshold criterion; and thresholding the digitized image according to said criterion so that each pixel in said digitized image having an gray-scale intensity value exceeding a respective threshold, is reassigned a maximum gray-scale intensity value;

whereby, any photolithographically defined lines in the thresholded image can be readily evaluated for width uniformity by visual inspection upon display or by analysis upon computer analysis.

2. A method as recited in claim 1 wherein said photolysis releases an acid including said hydrogen ions and respective halogen ions.

* * * * *